United States Patent [19]

Gainey et al.

[11] Patent Number: 4,793,543
[45] Date of Patent: Dec. 27, 1988

[54] SOLDER JOINT

[75] Inventors: Trevor C. Gainey; Ian Hall; Alan R. Jones, all of Gt Yarmouth, Great Britain

[73] Assignee: STC PLC, London, England

[21] Appl. No.: 91,054

[22] Filed: Aug. 28, 1987

[30] Foreign Application Priority Data

Aug. 28, 1986 [GB] United Kingdom ................. 8620793

[51] Int. Cl.$^4$ .......................... B23K 1/20; B23K 31/02
[52] U.S. Cl. ..................................... 228/121; 228/124; 228/174; 228/254; 228/263.12; 228/123; 156/87; 29/832; 29/840
[58] Field of Search ................ 228/121, 122, 123, 124, 228/263.12, 165, 174, 254; 156/87, 277, 292; 29/832, 840

[56] References Cited

U.S. PATENT DOCUMENTS

| 3,934,336 | 1/1976 | Morse | 228/263.12 |
| 4,409,278 | 10/1983 | Jochym | 228/124 |
| 4,413,766 | 11/1983 | Webster | 228/123 |
| 4,540,462 | 9/1985 | Mizunoya et al. | 228/263.12 |
| 4,650,107 | 3/1987 | Keser | 228/123 |

FOREIGN PATENT DOCUMENTS

| 538834 | 1/1977 | U.S.S.R. | 228/124 |
| 1215908 | 3/1986 | U.S.S.R. | 228/263.12 |
| 1440545 | 6/1976 | United Kingdom | 228/123 |

OTHER PUBLICATIONS

Research Disclosure, "Low Stressed Bonding Structure ...", No. 270, Oct. 1986.
Semiconductor International, Sep. 1984, "Thermal Effect of Die Bonding".

Primary Examiner—Nicholas P. Godici
Assistant Examiner—Samuel M. Heinrich
Attorney, Agent, or Firm—Lee & Smith

[57] ABSTRACT

A power component such as a power transistor is mounted on an insulating substrate of, e.g., beryllia by using a thick film deposition technique. A first layer (2) is deposited and a second layer (3) is deposited over the first layer to produce a regular series of troughs and lands, in the preferred embodiment troughs and ridges, whereby voiding in the solder bond is minimized if not eliminated to thus maintain a good thermal conductivity between the component and the substrate.

9 Claims, 2 Drawing Sheets

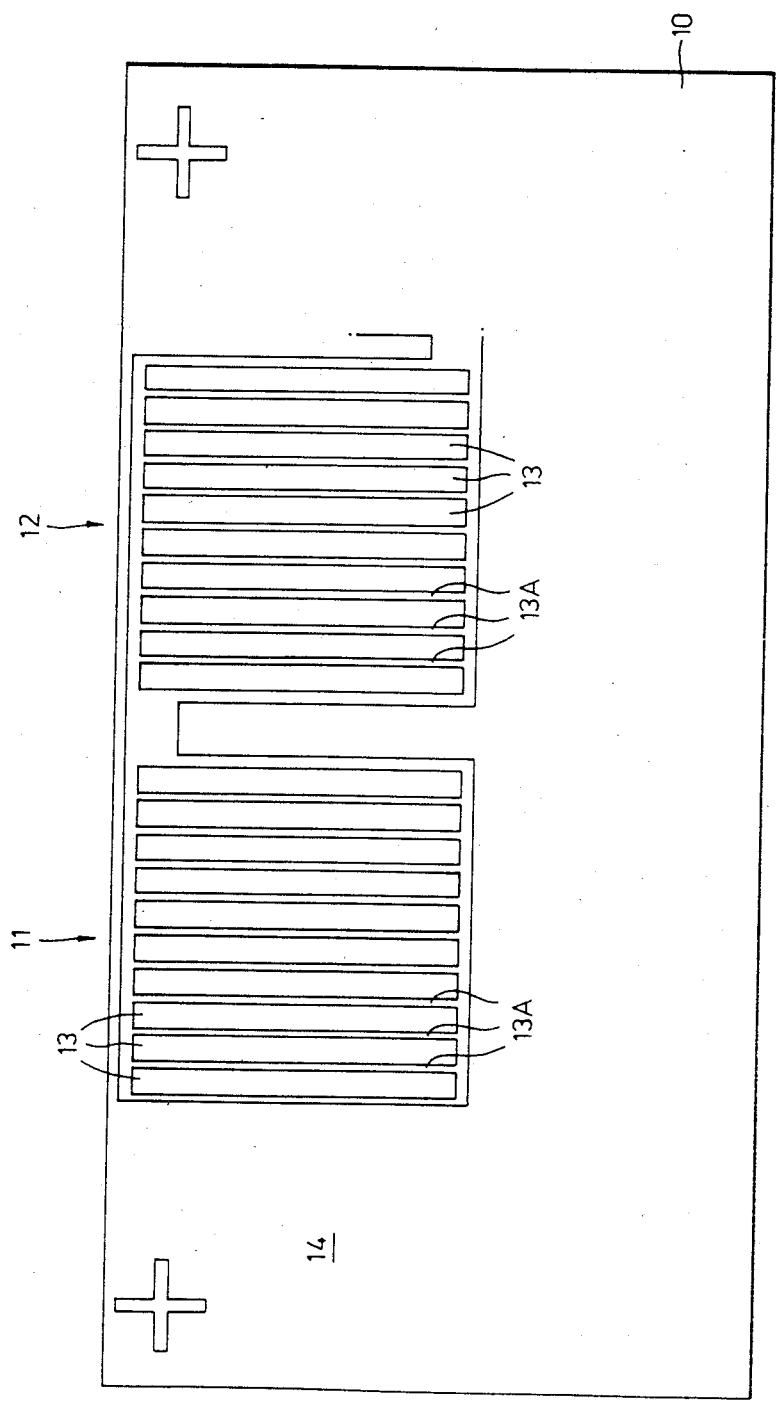

SOLDER JOINT

BACKGROUND OF THE INVENTION

This invention relates to solder joints, particularly a solder joint between a component which generates heat and a substrate on which it is to be soldered.

PRIOR ART

An article entitled "Thermal effect of die bond voids" in the magazine "Semiconductor International" September 1984, there is discussed an analysis of the effect of die bond voids on thermal performance of ceramic, metal and plastic packages. The article explains that in the operation of many semiconductor devices, the effective dissipation of internally generated thermal energy is critical to both device performance and the components reliability. A devices' useful lifetime is an exponential function of junction temperature, decreasing by approximately a factor of two for every 10° C. increase in temperature. In the last few years however increased focus on quality and reliability has rejuvenated interest in minimising the junction temperature to slow the metallurgical/material interactions commonly causing failure.

The article discusses the use of solders, in particular for die attach in the TO-3 steel and 24-lead CERDIP packages and silver filled organic epoxys in the 14-lead p-DIP and TO-3 aluminium packages. It explains that to effectively produce a low concentration of voids in the soft solder die bond, solder preforms of specific compositions were used following assembly procedures in which only the die bonding temperature was varied. For higher void concentrations solder cream was employed in which solvent out-gassing during die attach produces excessive voiding unless special precautions are taken. For example the TO-3 solder assembly involved die bonding in a belt furnace under hydrogen atmosphere with peak temperatures of 370° to 470° C.

British Patent Specification No. 144054 has already considered the problem in relation to bonding chips to metal surfaces and proposes forming a plurality of parallel grooves in the metal substrate using a grooving tool.

Such a process is suitably for ductile materials but is not suitable for more brittle materials such as certain insulating substrates e.g. beryllia.

OBJECT OF THE INVENTION

The problems referred to above in the above mentioned article are applicable in the attachment of semiconductor devices to insulating substrates and it is an object of the present invention to devise an attachment technique to an insulation substrate in which these problems are to a large extent avoided.

SUMMARY OF THE INVENTION

According to the present invention there is provided a method of mounting an electrical component on to a discrete area of an insulating substrate, comprising providing on said discrete area a first conductive layer on the substrate and providing a second conductive layer over the first layer, the second layer forming an evenly distributed series of troughs and lands, and securing the component on to the second layer by means of an adhesive such as solder.

According to another aspect of the invention there is provided an insulating substrate having for mounting a heat-generating device, a mounting pad in the form of a discrete area on which has been formed a first thick film layer and a second thick film layer on top of the first, the second layer being in the form of an evenly distributed series of troughs and lands.

BRIEF DESCRIPTION OF THE DRAWINGS

In order that the invention can be clearly understood reference will now be made to the accompanying drawings in which:

FIG. 2 shows the layout of two die bonding areas made according to an embodiment of the invention.

DESCRIPTION OF THE PREFERRED EMBODIMENTS

Figure 1:
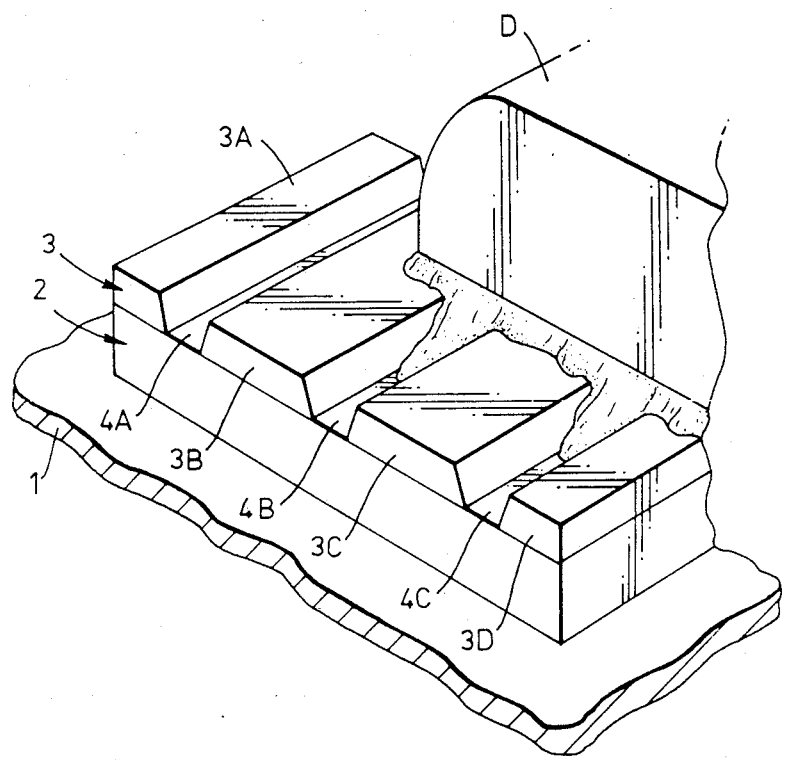
FIG. 1 shows an outline of a die bonding area topography formed by thick film deposition on an insulating substrate for improved die bonding, according to an embodiment of the invention

Referring to FIG. 1 a ceramic substrate 1 of beryllia or alumina has provided thereon a thick film solder pad comprising a first layer 2 of conductive thick film material such as a material sold by DuPont under their reference number 9923. This is a complete and continuous layer. A second thick film layer 3 is provided in a pattern defining a series of ridges 3A, 3B, 3C, 3D etc, evenly spaced with grooves in between, 4A, 4B, 4C etc. This layer is made of the same material as the layer 2 and is positioned directly on top of the first layer. The ridges are typically 0.5 mm wide and the grooves typically 0.15 mm wide.

When a power semiconductor component is soldered to this pad, any voids in the joint are channelled into the grooves which in this embodiment occupy less than 20% of the available surface area of the solder joint interface. This improved solder coverage gives better thermal dissipation and improved mechanical strength. It is to be noted that the invention is not limited to solder bonds but also covers bonds of similar construction made with materials other than those traditionally associated with the thick film circuit technology and solder.

The materials used for the first and second layers are either copper, palladium, gold, silver, platinum gold, or palladium silver, in any combination.

In the embodiment described the depth of the grooves is typically 0.03 mm.

The groove spacing could be as small as 0.05 mm and the percentage of grooves to ridges could be as low as 10%. It is thought unlikely that the percentage of grooves to ridges could exceed 30% and still achieve an acceptable bond.

Although a series of grooves and troughs has been described and is thought to be the most practical implementation of the invention, it is also possible that any series of raised lands, for example a crisscrossing arrangement of ribs and grooves leaving raised lands at the intersections, would be possible, provided the proportion of lands to grooves is 70% or more.

Referring now to FIG. 2 there is shown a circuit layout for a pair of solder pads each similar to the one described in FIG. 1 and wherein here the ceramic substrate 10 has two solder pads 11 and 12 comprising a series of ribs such as 13 made as described with reference to FIG. 1 and insulated from a surrounding conductive area 14 to which connection can be made to the semiconductor devices soldered to the ribs 13 and grooves 13A. A typical semiconductor device which would be soldered on to the rib structure would be an MOS power transistor.

What we claim is:

1. A method of mounting an electrical component on to a discrete area of an insulating substrate, comprising providing on said discrete area a first thick film conductive layer on the substrate and providing a second thick film conductive layer over the first layer, the second layer forming an evenly distributed series of troughs and lands, and securing the component on to the second layer by means of an adhesive such as solder.

2. A method as claimed in claim 1, wherein the ratio of troughs to lands is 30% or less of the discrete area.

3. A method as claimed in claim 1 wherein the troughs are in the form of elongate grooves separated by elongate ribs.

4. A method as claimed in claim 1 wherein the electrical component is a power MOS transistor.

5. A method as claimed in claim 1, wherein the first conductive layer is screen printed on to the substrate and the second conductive layer is screen printed on top of the first layer.

6. A method as claimed in claim 1 wherein the substrate is beryllia or alumina.

7. A method as claimed in claim 1 wherein the materials used for the 1st and 2nd layers are selected from the group consisting of copper, palladium, gold, silver, platinum gold, and palladium silver, in any combination.

8. An insulating substrate for mounting a heat-generating device, comprising a mounting pad in the form of a discrete area on which has been formed a first thick film layer and a second thick film layer on top of the first, the second layer being in the form of an evenly distributed series of troughs and lands.

9. An insulating substrate as claimed in claim 8, in combination with an electrical component which in use will generate heat, said component being soldered to said series of troughs and lands in said discrete area.

* * * * *